(12) United States Patent
Sridhara et al.

(10) Patent No.: US 11,121,729 B1
(45) Date of Patent: Sep. 14, 2021

(54) READ CHANNEL BUFFER MANAGEMENT FOR HIGHER THROUGHPUT DECODING

(71) Applicant: Seagate Technology LLC, Fremont, CA (US)

(72) Inventors: Deepak Sridhara, Longmont, CO (US); Jason Bellorado, San Jose, CA (US); Ara Patapoutian, Hopkinton, MA (US); Marcus Marrow, San Jose, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 16/944,050

(22) Filed: Jul. 30, 2020

(51) Int. Cl.
 *H03M 13/00* (2006.01)
 *G11B 20/18* (2006.01)
 *H03M 13/11* (2006.01)

(52) U.S. Cl.
 CPC ..... *H03M 13/6343* (2013.01); *G11B 20/1833* (2013.01); *H03M 13/1111* (2013.01); *H03M 13/6331* (2013.01)

(58) Field of Classification Search
 CPC .......... G11B 20/1833; H03M 13/1111; H03M 13/6331; H03M 13/6343
 See application file for complete search history.

(56) References Cited

U.S. PATENT DOCUMENTS

| | | | | |
|---|---|---|---|---|
| 5,490,149 A * | 2/1996 | Nylander-Hill | ........ | G11B 20/18 714/5.1 |
| 8,458,580 B2 * | 6/2013 | Isono | ............... | G11B 20/10527 714/807 |
| 8,988,800 B1 * | 3/2015 | Varnica | ............. | G11B 20/1217 360/31 |
| 9,576,040 B1 * | 2/2017 | Cox | ....................... | G06F 16/273 |
| 9,928,854 B1 * | 3/2018 | Jury | ........................ | G11B 5/035 |
| 10,140,180 B1 * | 11/2018 | Sridhara | ............... | H03M 13/29 |
| 10,177,791 B1 * | 1/2019 | Sridhara | ........... | H03M 13/2909 |
| 2004/0250177 A1 * | 12/2004 | Bychkov | ............. | G06F 11/1068 714/54 |
| 2014/0136919 A1 * | 5/2014 | Katagiri | ............. | G11B 20/1833 714/755 |
| 2015/0089278 A1 * | 3/2015 | Patapoutian | ........ | G06F 11/1048 714/6.12 |
| 2017/0116246 A1 * | 4/2017 | Fang | ................... | G06F 16/2272 |

* cited by examiner

*Primary Examiner* — Albert Decady
*Assistant Examiner* — Enamul M Kabir
(74) *Attorney, Agent, or Firm* — Holzer Patel Drennan

(57) ABSTRACT

An error recovery process provides for identifying a set of failed data blocks read from a storage medium during execution of a read command, populating sample buffers in a read channel with data of a first subset of the set of failed data blocks, and initiating an error recovery process on the data in the sample buffers. Responsive to successful recovery of one or more data blocks in the first subset, recovered data is released from the sample buffers and sample buffers locations previously-storing the recovered data are repopulated with data of a second subset of the set of failed data blocks. The error recovery process is then initiated on the data of the second subset of the failed data blocks while the error recovery process is ongoing with respect to data of the first subset of failed data blocks remaining in the sample buffers.

17 Claims, 6 Drawing Sheets

READ CHANNEL BUFFER MANAGEMENT FOR HIGHER THROUGHPUT DECODING

BACKGROUND

Command completion time (CCT) is a key metric pushing areal density in data storage devices today. For cloud storage customers with stringent CCT requirements, it is critical that read/write failures be responded to by invoking powerful recovery algorithms early in the retry sequence to minimize the time to successful recovery.

When a data block read from a storage medium contains errors (e.g., an error correction decoder fails on an initial attempt), the data block is said to be a "failed data block." Storage drives may be equipped to employ a number of mechanisms to attempt recovery of failed data blocks. In many cases, a simple re-read or two may be sufficient to recover the data. This is particularly true in instances when a read is impacted by seek-and-settle errors and/or when the read head is positioned off-track, such as due to environmental vibrations. When re-read attempts do not suffice to recover data of failed data blocks, various error corrections code algorithms may be employed. Due to the sequential practice of re-read attempts followed by these recovery algorithms, CCT is typically greater (worse) in instances when re-reads fail.

SUMMARY

An error recovery method provides for identifying a set of failed data blocks read from a storage medium during execution of a read command; populating sample buffers in a read channel with data of a first subset of the set of failed data blocks; and initiating an error recovery process on the data of the first subset of the set of failed data blocks. Responsive to successful recovery of the data of one or more data blocks in the first subset, data recovered from the sample buffers is released and the released data is repopulated in the sample buffers with data of a second subset of the set of failed data blocks. An error recovery process is initiated on the second subset of the failed data blocks while the error recovery process is ongoing with respect to data of the first subset of failed data blocks remaining in the other sample buffers.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

BRIEF DESCRIPTIONS OF THE DRAWINGS

DETAILED DESCRIPTION

Figure 1:
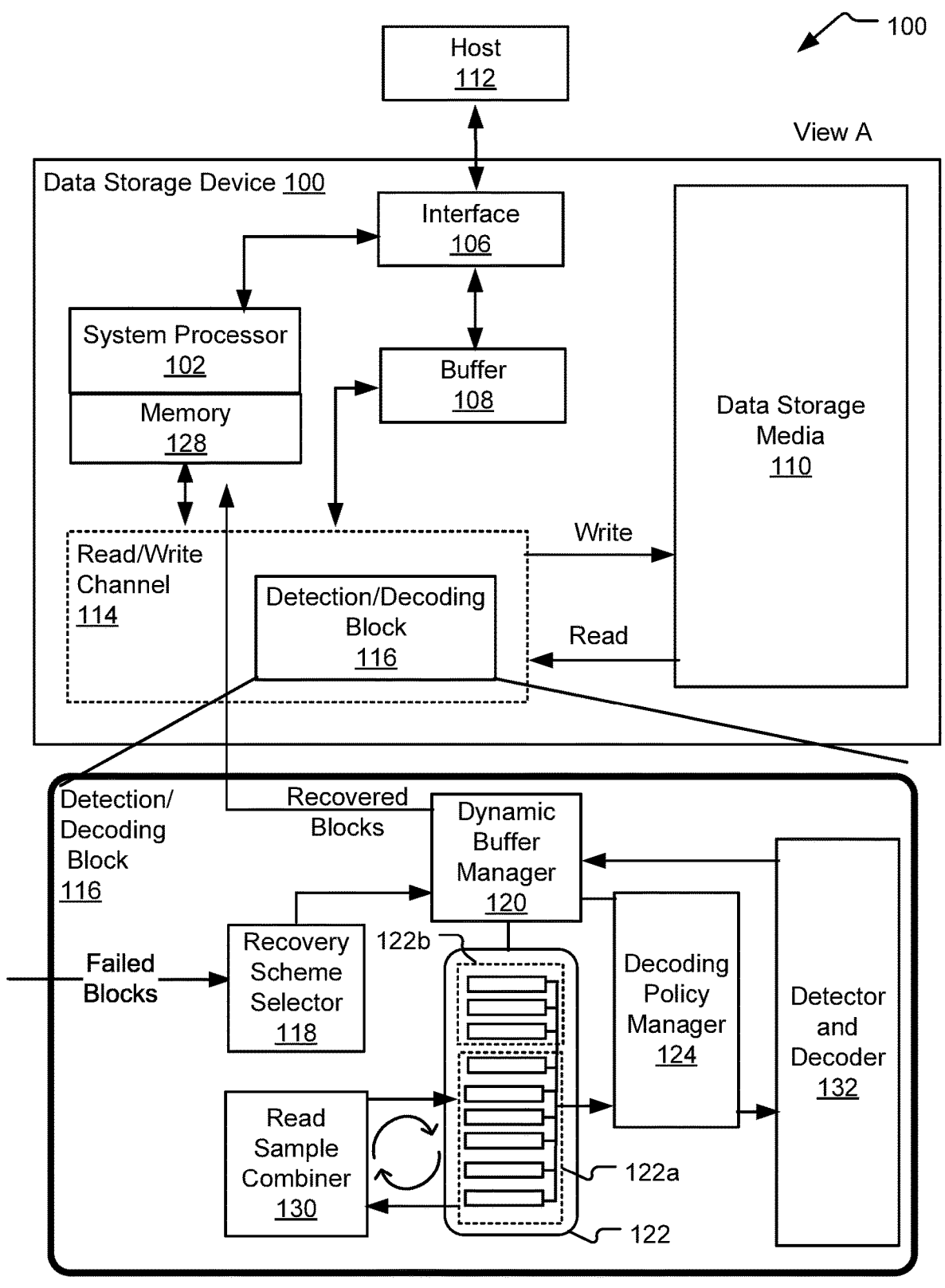
FIG. 1 illustrates an example storage device that implements read channel buffer management techniques to support multiple decoding schemes in a single buffer space for higher decoding throughput.

For a storage drive to satisfy stringent command completion time (CCT) requirements now mandated by many cloud storage providers, failed data blocks must be recovered in a short time during which a disk may make only a few full revolutions on its axis. For example, in a near-line drive where a revolution is around 8.33 milliseconds, a disk may make about 6 or fewer revolutions in the interval spanning receipt of a read command to the expiration of a 50 millisecond CCT requirement. If one or more of the data blocks read back from the media contains errors (e.g., a parity check fails), data recovery algorithms may be invoked to try to recover the data. However, with a 50 millisecond or smaller CCT requirement, it is critical that the most powerful data recovery algorithms be invoked as early as possible within this window.

One effective data recovery tool is a simple re-read, also referred to herein as a "retry," of the failed data blocks. When executing a retry in a hard disk drive (HDD), the drive waits for the next pass of the failed data blocks under the read head and collects a second sample of the data. Another powerful recovery algorithm is recursive read averaging (RRA). In RRA, samples from multiple reads are combined or averaged together in a particular manner, such as by using maximum-ratio combining, to increase the signal to noise ratio and yield better read samples to provide to a detector and decoder. While re-reads rely on "better" noise realizations to make a sector recoverable on a subsequent attempt, RRA instead averages multiple noise realizations together, improving signal quality, and is therefore a more powerful tool for hard to read sectors that are not recoverable with simple re-reads.

Existing drives typically utilize read channel buffer space to support one recovery scheme at a time. For example, the buffer space is populated with a set of failed data blocks and the blocks are worked on for a set period of time via an RRA scheme, such as until all sectors have converged or some time limit has elapsed. Once the time period has elapsed, the buffers are all released at the same time such that they may be then be reallocated to support either a new type of recovery scheme or a repeat of the same type of recovery scheme on a new group of data blocks.

The term read sample combining recovery process is used herein to refer to a recovery process that combines samples of like-data to improve data quality. Recursive read averaging (RRA) is the primary example of a read sample combining recovery process disclosed herein, but it should be understood that the disclosed recovery processes may provide re-tries concurrent with any type of read sample combining recovery process.

According to one implementation, the systems disclosed herein facilitate higher-throughput decoding by supporting multiple decoding schemes in a single buffer space. For example, some fraction of available buffers in a read/write channel may be allocated to effectuate retry decoding attempts while others buffers in the channel are simultaneously allocated to effectuate RRA decoding attempts. In the same or another implementation, buffers are dynamically reallocated to support different recovery schemes and/or to support recovery of different sectors during ongoing recovery operations on a given set of failed data blocks associated with a read command. For example, all channel buffers may initially be allocated to support recovery efforts for a first scheme (e.g., RRA) and, over time, one or more such buffers may be reallocated to support a different recovery scheme (e.g., re-tries). Due, in part, to the aforementioned dynamic buffer management techniques, two or more types of recovery schemes (RRA, retry, etc.) may be performed during a single revolution of a disk to recover different blocks of a same data track.

In still further implementations of the disclosed technology, read channel buffers are dynamically released and repopulated during on-going recovery operations for a set of failed data blocks. For example, buffer data may be flushed to a host once it is successfully recovered and the buffer may, at that time, be dynamically repopulated with new data from the same set of failed data blocks such that the buffer may then be used to support the ongoing recovery operations for other data blocks in the set (e.g., other sectors that have failed on a same data track). This process improves decoding speed as compared to algorithms that wait until a recovery process is complete on a given set of data blocks to release channel buffers.

In some further implementations of the herein disclosed technology, decoding resources are allocated among failed data blocks differently (e.g., decoding processing time is unequally distributed between blocks) based on the particular recovery schemes (retry, RRA, etc.) that are being used on each individual data block.

FIG. 1 illustrates an example storage device 100 that implements read channel buffer management techniques to support multiple decoding schemes in a single buffer space for higher decoding throughput. The storage device 100 includes a system processor 102 for executing read and write commands received from a host 112 across an interface 106. In one implementation, the system processor 102 is a microprocessor such as a system-on-chip (SOC) or application-specific integrated circuit (ASIC). The system processor 102 executes software elements stored in memory 124, which may include volatile memory (e.g., RAM, DRAM, SRAM) and/or non-volatile memory (e.g., Flash). The system processor 102 is coupled to a buffer 108 through a read/write channel 114. The buffer 108 can temporarily store user data during read and write operations and may, in some implementations, be capable of storing read and write commands from the host 112 that are pending execution by the system processor 102.

The system processor 102 executes read and write operations from the host 112 on a data storage media, which may include one or more tangible-computer readable storage media. As used herein, tangible computer-readable storage media refers to a device of manufacture and is explicitly defined to exclude freely-propagating communication signals, such as a carrier wave or other signal transport mechanism. In a majority of the implementations described herein, the data storage media 110 includes one or more magnetic disks; however, the data storage media 110 may, in various implementations, include other types of storage including without limitation solid state storage (SSDs such as flash memory), CDROM, digital versatile disks (DVD) or other optical disk storage, magnetic cassettes, magnetic tape, RAM, ROM, EEPROM, etc.

When executing read and write operations from the host 112, the system processor 102 generates and transmits control signals through the read/write channel 114, which includes a detection/decoding block 116. The detection/decoding block 116 may be understood as including a collection of hardware and software elements that are controlled and executed by the system processor 102. During a write operation, data written to the data storage media 110 may be read back and verified by the detection/decoding block 116 using an error correction code to ensure that the data is written to disk correctly. Likewise, during a read operation, data read back from the data storage media 110 is verified by the detection/decoding block 116.

By example and without limitation, View B of FIG. 1 illustrates a few exemplary elements that may be included within the detection/decoding block 116. Specifically, the detection/decoding block 116 includes a recovery scheme selector 118 that receives failed blocks read from the data storage media 110 and that selects a recovery scheme for each failed data block. For example, the recovery scheme selector 118 may sequentially receive failed data blocks corresponding to sectors read from a same data track as the data storage media 110 rotates below a read/write head. For each different one of the failed data blocks targeted by a same read command, the recovery scheme selector 118 selects one of multiple different available recovery schemes to use to attempt to recover data of the failed data block. For example, the recovery scheme selector 118 may select an RRA recovery scheme to decode some of the failed data blocks on a data track while selecting a simple retry to decode other failed data blocks on the data track.

After selecting a recovery scheme for a particular failed data block, the recovery scheme selector 118 provides a dynamic buffer manager 120 with the failed data block, information identifying the selected recovery scheme (e.g., RRA or retry), and a block identifier (e.g., a sector ID) for the data block. The dynamic buffer manager 120 directs the data to an available buffer in a block of sample buffers 122 of the read channel and updates a block-to-buffer map (not shown) that associates each one of the sample buffers 122 with both (1) a block ID for the data currently stored in the sample buffer and (2) the recovery scheme that has been selected for the failed data block. In this sense, the block-to-buffer map identifies a first subset 122a of the sample buffers 122 that are dedicated to a first recovery scheme (e.g., RRA) and a second subset 122b of the sample buffers 122 that are concurrently dedicated to a second recovery scheme (e.g., simple re-reads). Some implementations of the disclosed technology may provide for dynamic buffer reallocations to concurrently support more than two different recovery schemes on a same set of failed data blocks associated with a same host read command.

Once the sample buffers 122 are initially populated with data from the failed data blocks, the selected recovery schemes are initiated and a decoding policy manager 124 determines how to allocate resources (processing time) of a detector and decoder 132 among each of the different sample buffers such that the different selected recovery schemes may be performed concurrently (e.g., on the same revolution of the disk drive). As used herein, two processes are understood as concurrently executing when their respective operations span any overlapping interval of time. If, for example, a first recovery process entails multiple rounds of sample combining in a recovery attempt for a failed data block and a second recovery process (e.g., a re-read) is performed on another data block in between two of those rounds of sample combining operations, the processes are concurrent.

During an ongoing data recovery process, data within each of the sample buffers 122 is processed and managed differently depending on the recovery scheme selected for the data residing in the buffer. By example and without limitation, FIG. 1 illustrates a read sample combiner 130 that performs operations to support a read sample combining recovery process (e.g., RRA). Read sample combiner 130 may be understood as circuitry that performs operations to combine and/or average together corresponding read samples collected at different times. In one implementation, the read sample combiner 130 performs a recursive read averaging (RRA) recovery process. For example, the read sample combiner 130 may receive and initially store data of a failed sector "N" in one of the sample buffers 122. When a second pass of a read element is made over sector N, this data is read again and may at that time be averaged with the earlier-read data of sector N and re-saved in another one of the sample buffers 122. The dynamic buffer manager 120 updates the block-to-buffer mapping each time a sample is updated and moved to a different one of the sample buffers 122.

Each time that a data sample is updated via averaging with another corresponding data sample read from the same physical data block (sector), the updated data is subjected to a decoding attempt by the detector and decoder 132. If the decoding attempt fails, the data may be retained in the sample buffers 122 for further updates by the read sample combiner 130 and further decoding attempts on the updated versions of the sample. If, in contrast, the decoding attempt succeeds, the decoded data may be released to the host and the buffer holding the samples for this sector may be freed-up.

In contrast to the above-described read sample combining recovery process (e.g., RRA) in which a sample may be preserved in the sample buffers 122 and updated multiple times over multiple rounds, a "retry recovery process" subjects a re-read sample of a failed data block to a single decoding attempt by the detector and decoder 132. If the decoding attempt succeeds, the decoded data is released to the host 112 and the sample buffer is freed up. If the decoding attempt fails, the decoded data is discarded and the samples in the the sample buffers 122 are retained to be picked up for another decoding attempt on a subsequent pass.

The decoding policy manager 124 determines how to allocate decoding resources of the detector and decoder 132 among the different sample buffers 122. Decoding resource allocation may govern the timing of when certain samples are processed, such as when buffers are at capacity and conflicts arise pertaining to dropping samples not yet processed or retaining old samples instead of acquiring samples for a new sector. Additionally, decoding resource allocation may also govern the amount of time that the detector and decoder 132 allocates to processing each individual sample. The decoding policy manager 124 may, in some implementations, elect to process samples in an order that is independent of the order of the corresponding sectors on the media.

In one implementation, the decoding policy manager 124 implements a decoding scheme under which the amount of time dedicated to processing each sample is based on the decoding scheme selected for the sample. For example, a greater amount of time may be allocated for decoding RRA samples than retry samples since it may be assumed that recovery is more likely on RRA samples that improved in quality with each iteration.

In one implementation where the storage device 100 decodes data read from a magnetic disk, the detector and decoder 132 includes a Viterbi detector that implements a soft output Viterbi Algorithm (SOVA engine) and a decoder that implements a decoding scheme such as a low-density parity check (LDPC) or the Reed-Solomon (RS) code. During each recovery attempt on a different one of the samples in the sample buffers 122, the Viterbi detector iterates back and forth cyclically with the decoder. During each such iteration, the Viterbi detector estimates a likelihood that each bit is a one or a zero (e.g., a log-likelihood ratio (LLR)) and the decoder uses this likelihood to attempt to re-interpret the bit stream and parity bits included in the bit stream. Due to this iterative back and forth between the decoder and the SOVA engine, decoding time may be understood in terms of "iterations" performed by the detector and decoder 132.

If the detector and decoder 132 is able to decode and correct the failed block within a predefined maximum number of iterations, the corrected data is sent to system memory 128 (e.g., DRAM) accessible by a system controller, while the associated block data is released from the sample buffers 122 and the read/write channel. If the detector and decoder 132 is not able to recovery the failed block, management of the data may depend on the recovery process selected for the failed data block. If, for example, the failed data block has been selected for an RRA recovery process, the sample may be retained in the sample buffers 122 until it is updated and subjected to a next decoding attempt. In contrast, if the failed data block has been selected for a retry process and is not successfully recovered on a given decoding attempt, the data may be evicted (e.g., erased or dedicated for overwrite) from the sample buffers 122 such storage space is freed up within one of the buffers to receive and store data of a next new sample instead.

In one implementation, the dynamic buffer manager 120 manages a list of the failed data blocks for a given data track. As individual blocks from the list are recovered, sent to the system memory 128, and released, the dynamic buffer manager 120 updates the list to remove the recovered blocks. If, for example, there are 10 sample buffers and 19 failed sectors resulting from execution of a single read command, the dynamic buffer manager 120 keeps a list of the block IDs for the 19 failed sectors, removing IDs from the list as the corresponding data block is recovered.

As the sample buffers 122 are dynamically freed-up due to successful block recoveries, the dynamic buffer manager 120 dynamically reallocates the freed-up sample buffers 122 to receive additional data from the same list of failed sectors (e.g., other failed sectors of the same data track). In the above example where there are 10 sample buffers and 19 failed blocks, buffers freed-up in the above-described manner may be dynamically repopulated with data from the 9 remaining failed data blocks not initially read into the sample buffers 122. For example, successful recovery of two data blocks frees up two of the 10 buffers; consequently, two of the nine remaining failed data blocks can then be read into those buffers and, in turn, provided to the detector and decoder 132.

In some implementations, the dynamic buffer manager 120 allocates a predefined number of the sample buffers 122 to each of the different decoding schemes selectable by the recovery scheme selector 118. If, for example, the recovery scheme selector 118 selects between an RRA recovery scheme and a retry recovery scheme, the dynamic buffer manager 120 may reserve a set number of the buffers (e.g., 8 of 10 buffers) for storing data selected for the RRA recovery scheme while allocating another set number of the buffers (e.g., 2 of 10 buffers) for storing data selected for the retry recovery scheme. In other implementations, individual sample buffers 122 are dynamically reallocated to support different recovery schemes at different points in time during an ongoing recovery process on a set of data blocks.

In one implementation, the dynamic buffer manager 120 is implemented entirely in hardware such that the sample buffers 122 can be populated, released, and re-allocated (as described above) and/or simultaneously support different concurrent recovery processes (RRA, re-reads) all without firmware intervention. Likewise, the decoding policy manager 124, recovery scheme selector 118, and/or read sample combiner 130 may also be implemented entirely in hardware, or in a mix of hardware and software.

Figure 2:
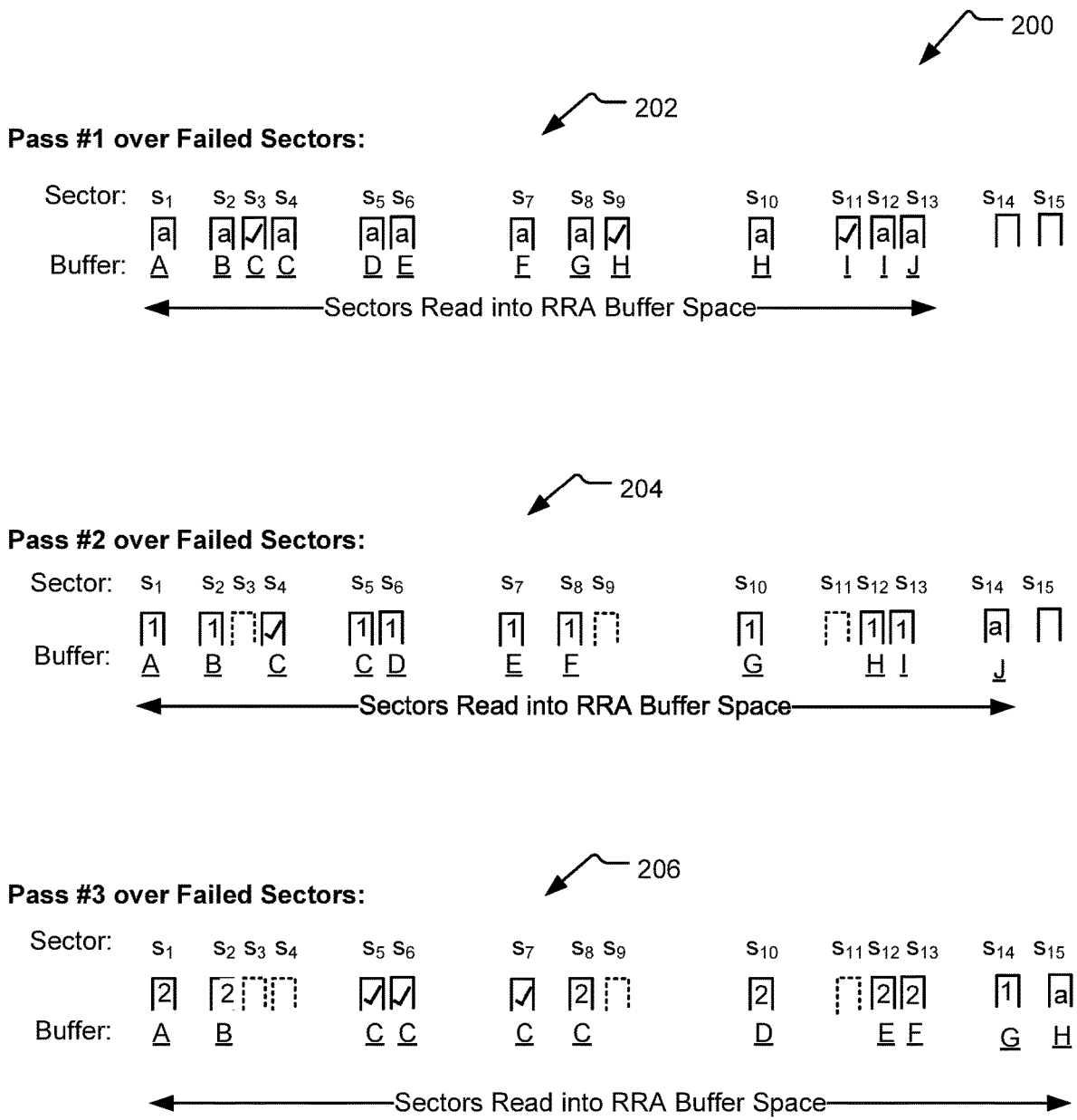
FIG. 2 illustrates example recovery operations performed by a system that provides for selectively vacating and dynamically repopulating read channel buffers during an on-going recovery process for a group of failed data blocks.

FIG. 2 illustrates example recovery operations 200 performed by a system that provides for selectively vacating and dynamically repopulating read channel buffers during an on-going recovery process for a group of failed data blocks. According to one implementation, the example recovery operations of FIG. 2 are performed by a detection/decoding block with characteristics the same or similar as those described with respect to the detection/decoding block 116 of FIG. 1. Although the system performing the recovery operations 200 may in some instances utilize a channel buffer space to support a single recovery scheme, the system is, in at least some implementations, adapted to support multiple concurrent recovery schemes in a single channel buffer space.

The recovery operations 200 are executed over the duration of multiple revolutions of a magnetic storage media. Three such revolutions, referred to as passes (e.g., pass #1, pass #2, and pass #3) are shown. During each one of the three passes, a read head is positioned to fly in close proximity to a target data track and to read (e.g., by opening a read gate) a number of previously-identified failed data sectors from the target data track.

In the illustrated example, 15 sectors have been identified as failed data blocks during an initial pass over the media that occurred prior to what is shown as "pass #1." Within the read channel, a dynamic buffer manager generates a list of these identified failed data blocks. For example, sector IDs for each of the 15 failed sectors may be stored in a hardware register. Although these 15 sectors may not necessarily correspond to contiguous (directly-adjacent) sectors on the data track, FIG. 2 uses the consecutive numbering scheme $S_1$ to $S_{15}$ to denote consecutively arranged sectors along a same data track. For example, it may be assumed that $S_1$ rotates below the read head before $S_2$ rotates below the read head, followed by $S_3$, $S_4$, and so on.

In the example of FIG. 2, the read channel of the system includes 10 sample buffers that are pre-allocated to an RRA recovery process. In FIG. 2, the capital letters A, B, C, D, E, F, G, H, I, J are used to identify the 10 sample buffers that are allocated to support an RRA recovery process. Although the read channel may also include one or more sample buffers allocated to a different type of recovery process (e.g., a retry attempt), those additional buffers are excluded from FIG. 2 and the description of the recovery operations 200 for simplicity of example. The buffers A-J are referred to collectively below as the "RRA buffer space." Because the buffers A-J may be freed-up and dynamically repopulated with other failed sectors, some of the buffers A-J may be populated two or more times (e.g., to sequentially store two or more failed sectors) during a single revolution of the disk below the read head.

The three-pass example of FIG. 2 is meant to be exemplary of one possible order in which the various buffers may be populated, freed-up, and repopulated. By example and without limitation, the buffers in FIG. 2 are filled in alphabetical order and it is generally assumed that each sample is processed by the decoder before the next consecutive sample arrives. For example, it is assumed that the decoder can finish processing S1 before S2 is received. While this represents one valid example that simplifies this description, it may also be the case that the processing of samples is out of sync with the cadence at which sample are received. For example, the processing of S1 may not finish until after S2 and S3 are stored. This order depends on implementation-specific decoding policies.

During a first pass of the read head over the identified 15 sectors (referred to below as "pass #1"), a first subset of operations 202 is performed. As the read head passes over each one of the 15 failed sectors initially on the failed sector list, a read gate is opened, which in turn allows a magnetoresistive sensor to read data of the underlying sector. Responsive to receipt of the data from the underlying sector, a recovery scheme is selected. In the illustrated example, an RRA recovery scheme is selected by default whenever one of the 10 buffers in the RRA buffer space is available to receive data.

During the first pass of the read head over the identified 15 failed sectors, the failed sectors are consecutively read into available buffers of the RRA buffer space. In FIG. 2, the lower-case letter "a" is used to denote a sector that is newly-acquired in the buffer space (an acquisition read) on the corresponding disk revolution and that was not successfully recovered during the disk revolution. An acquisition read of $S_1$ places $S_1$ into buffer A and a recovery attempt is performed; however, the data of $S_1$ is not recovered (and thus, annotated with a lowercase 'a' to indicate the data is retained in the buffer A). The next two failed sectors, $S_2$ and $S_3$, are acquired into buffers B and C, respectively, and recovery attempts are performed on each of these sectors in series. The recovery attempt of $S_2$ fails. Consequently, $S_2$ is retained in buffer B. However, the recovery attempt of $S_3$ succeeds (as indicated by a checkmark icon) and the recovered data of $S_3$ is released to the host, immediately freeing up buffer C such that buffer C may be repopulated on the same disk revolution with another one of the failed sectors from the data track.

Continuing the operations 202 on pass #1, sector $S_4$ is next read into buffer C after the data of sector $S_3$ is released from buffer C. While this conveys a basic concept of the implementation (e.g., that buffer C is repopulated on the same disk revolution), it may be understood that the freed-up buffer may be repopulated at any time during pass #1 with data of any one of the remaining failed data blocks. The determination of which failed block to read into each newly freed-up buffer may be based on logic that varies from one implementation to another.

Returning to the operations 202, sector $S_4$ is not successfully recovered prior to the end of pass #1, and $S_4$ is therefore retained in buffer C. Acquisition reads occur in series for the next several sectors $S_5$, $S_6$, $S_7$, $S_8$, and $S_9$, placing associated data in buffers D, E, F, G, and H, respectively. Sector $S_9$ is recovered during the read of the track but sectors $S_5$, $S_6$, $S_7$, and $S_8$ are not. Thus, the data of sectors $S_5$, $S_6$, $S_7$, and $S_8$ is retained in buffers D-G while the recovered data of $S_9$ is sent to the host, freeing up buffer H to be repopulated with data read from $S_{10}$. Sector $S_{10}$ is not successfully recovered during pass #1, it is retained in buffer H. Sector $S_{11}$ is read into buffer I and is successfully recovered, thereby freeing-up buffer I to receive data of $S_{12}$. However, $S_{12}$ is not recovered during pass #1 and therefore retained in buffer I. Sector $S_{13}$ is read into buffer J and retained following an unsuccessful first recovery attempt.

At the conclusion of pass #1, the 10 buffers in the RRA buffer space (A-J) have all been populated at least once. Since three of the failed sectors ($S_3$, $S_9$, and $S_{11}$) were successfully recovered during pass #1, three of the 10 buffers (C, H, and I) were re-populated during pass #1, facilitating recovery attempts on 13 sectors—more sectors than there exist buffers in the RRA buffer space. Due to a lack of available RRA buffers, sectors $S_{14}$ and $S_{15}$ are not acquired in the buffer space or worked on by the RRA recovery process during pass #1. Notably, some alternate implementations may subject these remaining failed sectors ($S_{14}$, Sits to re-reads or other types of recovery schemes during the pass, such as by using one or more sample buffers in the read channel that are external to the designated RRA buffer space (A-J). For example, if there were 12 sample buffers and the hardware policy was to allow only up to 10 sectors in any given time to participate in the RRA process, then in the above example, $S_{14}$ and Sits will have their samples saved in the sample buffers that are not part of RRA and given a re-read/decode attempt.

At the end of pass #1, the failed sector list is updated to remove sectors $S_3$, $S_9$, and $S_{11}$, which were recovered during the pass. Thus, of the original 15 failed sectors, 12 remain to be recovered.

During a pass #2, the read head again flies over the rotating data track including the failed sectors and a second subset of operations 204 is performed. On pass #2, system hardware suppresses a read gate as the already-recovered failed sectors $S_3$, $S_9$, and $S_{11}$ pass beneath the read head. Consequently, the data of these three sectors is not read into the channel buffer space.

Some of the sectors shown with respect to the operations 204 include a number '1,' which is intended to indicate that the sample has not been recovered at the conclusion of pass #2 but has been updated (e.g., read-averaged) once based on a second read of the same sector. Thus, at the conclusion of pass #2, buffers A, B, C, D, E, F, G, H, and I hold data samples that have been read-averaged once based on the two reads of the associated sector. During pass #2, all of the sectors $S_1$, $S_2$, $S_4$, $S_5$, $S_6$, $S_7$, $S_8$, $S_{10}$, $S_{12}$, and $S_{13}$ are updated via a read-averaging operation. Of these, only sector s4 is successfully recovered. The successfully recovery of $S_4$ during pass #2 allows for an acquisition read of $S_{14}$—a failed sector that was not read into the RRA buffer space during pass #1. At the end of pass #2, the failed sector list is updated to remove sector $S_4$. Thus, of the original 15 failed sectors, 11 remain to be recovered. Ten of these sectors are stored in the RRA buffer space and only one of the original 15 failed sectors ($S_{15}$) has not yet been acquired into RRA buffer space.

During pass #3, the read head again flies over the rotating data track including the failed sectors and a third subset of operations 206 is performed. On this pass, system hardware suppresses the read gate while the already-recovered sectors $S_3$, $S_4$, $S_9$, and $S_{11}$ pass beneath the read head. Consequently, the data of these four sectors is not read into the channel buffer space.

Some of the sectors shown with respect to the operations 206 include a number '2,' which is intended to indicate that the sample has not been recovered at the conclusion of pass #3 but has been updated (e.g., read-averaged) twice based on three reads of the same sector. Thus, at the conclusion of pass #3, buffers A, B, C, D, E, and F each store data samples that have been read-averaged twice based on the three reads of the associated sector. During pass #3, all of the sectors $S_1$, $S_2$, $S_5$, $S_6$, $S_7$, $S_8$, $S_{10}$, $S_{11}$, $S_{13}$, and $S_{34}$ are updated via a read-averaging operation. Since this is the first read-averaging update to $S_{14}$, $S_{14}$ is denoted with a '1' rather than a '2.' Based on this round of sample updates and recovery attempts, sectors $S_5$, $S_6$, and $S_7$ are all successfully recovered on pass #3 and buffer C is freed-up and repopulated four times. This re-use of buffer C allows for an acquisition read of sector $S_{15}$ into the RRA buffer space (e.g., buffer H). At the conclusion of pass #3, eight of the original 15 failed sectors remain to be recovered. This is less than the number of RRA buffers (10); consecutively, buffers I and J are not used. The above process may be repeated up to a predesignated number of RRA read-averaging rounds (e.g., a set time limit that may be quantized in terms of disk revolutions) or until none of the remaining failed sectors remains to be recovered. In some instances, sectors that are not successfully recovered via the RRA recovery process may be provided to another recovery process, such as iterative outer code (IOC).

According to one implementation, some or all of the recovery operations 200 are automated by hardware logic. For example, hardware logic may be executed to (1) maintain and update a list of failed sectors in a block-to-buffer map (e.g., mapping each sector ID to a current buffer and/or to a select recovery scheme); (2) control a read gate on a read head to selectively open for (e.g., permits reads) of the sectors included on the failed sector list at the time the read occurs; (3) remove successfully-recovered sectors from the failed sector list following each pass; (4) track a number of read-averaging operations that have been performed on data read from each sector included on the failed sector list; (5) selectively vacate (flush) and repopulate sample buffers with data of remaining failed data blocks (as described above) so as to maximize utility of the buffer space; and/or (6) manage the RRA process throughout the duration of a pre-programmed number of read passes over the failed sectors without firmware intervention so as to mitigate latencies that may otherwise arise due to I/O delays between drive firmware and hardware components.

Figure 3:
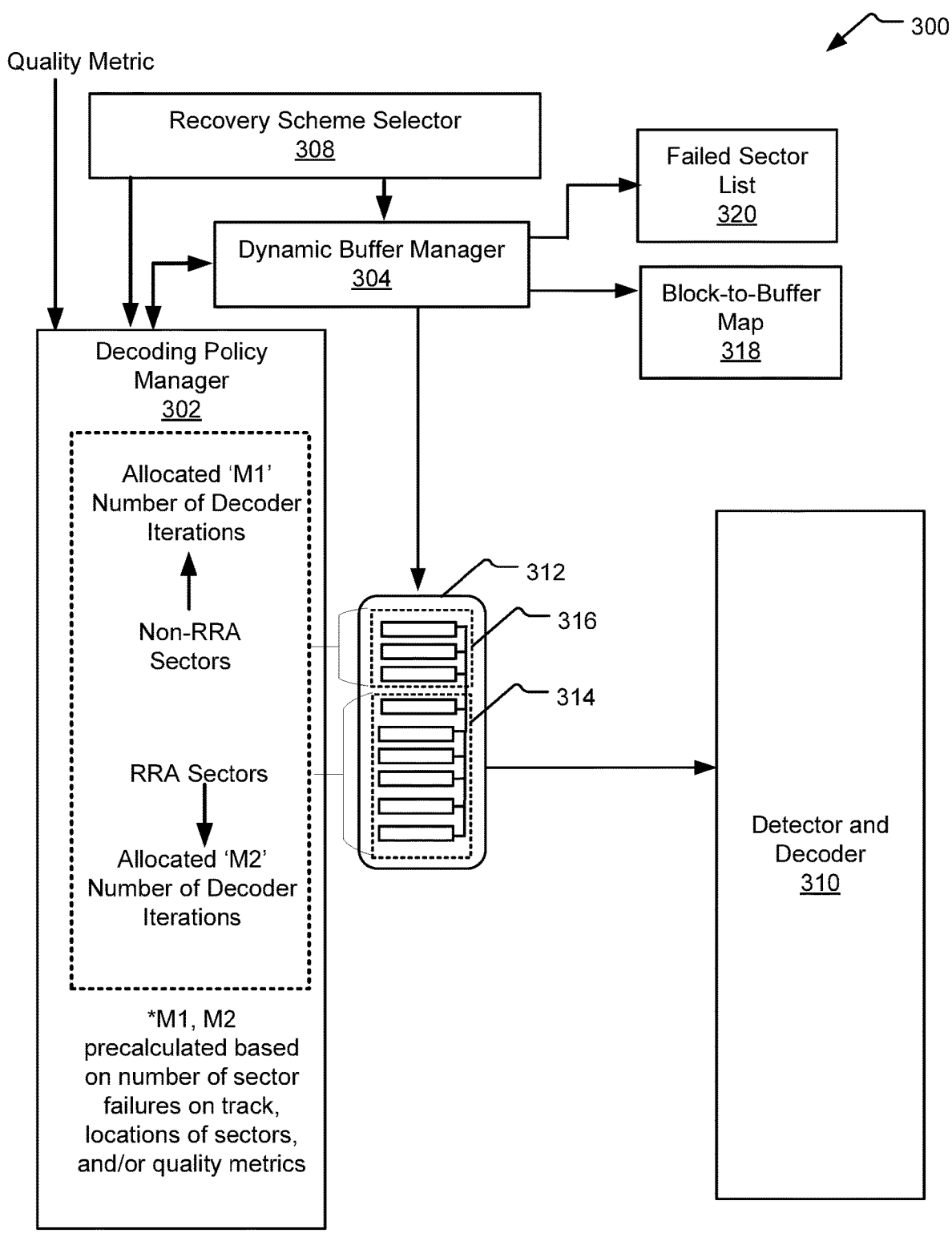
FIG. 3 illustrates aspects of an example detection/decoding block in a read channel that supports multiple concurrent recovery schemes in a single buffer space.
Figure 4:
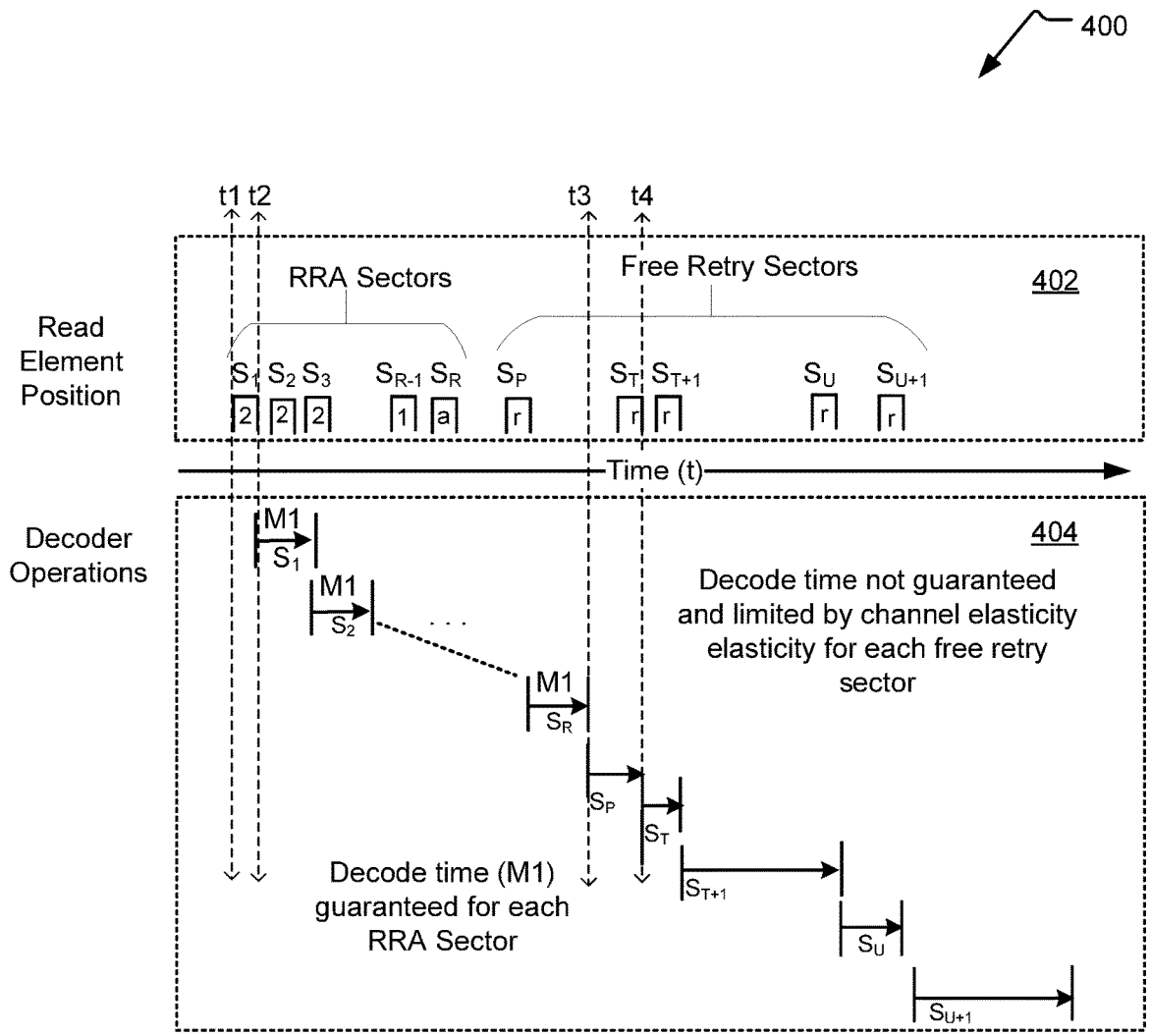
FIG. 4 illustrates a sequence of recovery operations performed according to example decoding policies that guarantee a number of decoding iterations for one recovery scheme while managing another concurrent recovery scheme with elasticity among remaining channel buffers.
Figure 5:
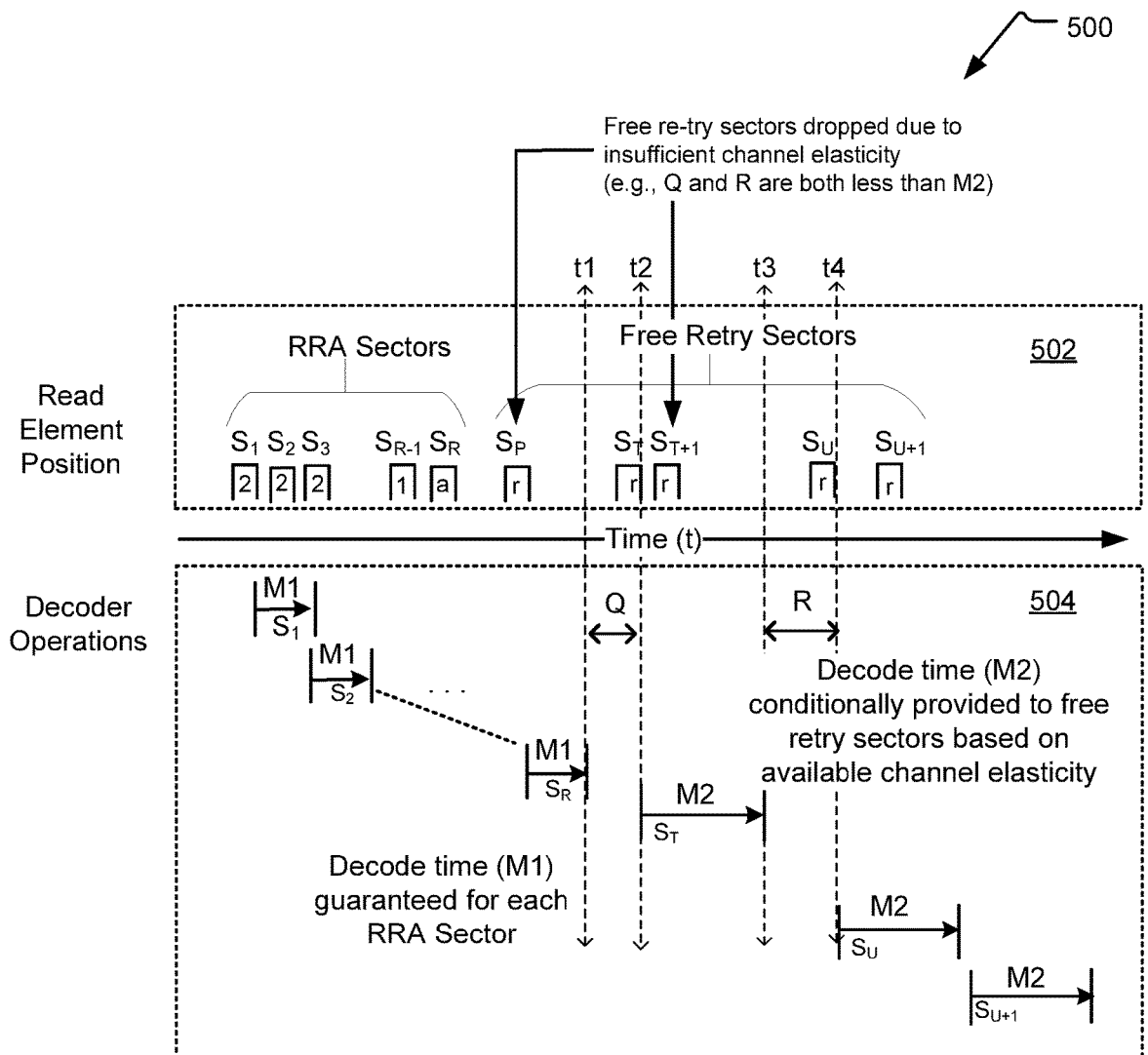
FIG. 5 illustrates an example sequence of recovery operations performed according to decoding policies that guarantee a number of decoding iterations for one recovery scheme and another number of decoding iterations for some, but not all, sectors processed according to a second recovery scheme.

Although not discussed above specifically with respect to the recovery operations 200, some implementations of the disclosed read channel buffer management technology may also include hardware adapted to select a recovery scheme (e.g., RRA v. non-RRA) to apply to each failed data block on a per-block basis (e.g., potentially implementing different recovery schemes for data blocks on a same data track), and/or to implement prioritization schemes that allocate decoding resources differently depending on the particular recovery scheme selected for a particular block and/or other factors such as those discussed in detail with respect to FIG. 3-5 below.

FIG. 3 illustrates aspects of an example detection/decoding block 300 in a read channel that supports multiple concurrent recovery schemes in a single buffer space. The detection/decoding block includes a recovery scheme selector 308, a dynamic buffer manager 304, and a decoding policy manager 302, which may be understood to include exclusively hardware logic or a combination of hardware and software logic.

Together, the dynamic buffer manager 304, decoding policy manager 302, and recovery scheme selector 308 perform operations to facilitate the usage of different recovery schemes on different failed data blocks targeted by a same host-initiated read command. These operations serve to control dynamic data flows between channel buffers (e.g., channel buffers 312) and a detector and decoder 310.

In one implementation, the channel buffers 312 (also referred to herein as the read channel buffer space) is partitioned into different logical and/or physical groups that are each utilized to support a different one of the multiple available recovery schemes. For example, the dynamic buffer manager 304 may allocate 85% of the channel buffers to support operations of an RRA recovery scheme and the remaining 15% to support operations of a re-read recovery scheme. By example and without limitation, the channel buffers 312 are shown to include 9 buffers total divide into two groups 314 and 316. The group 314 includes six buffers that are used to support an RRA recovery scheme, while the group 316 includes three buffers that are used to support an alternate (e.g., "non-RRA") recovery scheme. In one implementation, the non-RRA scheme is a retry recovery scheme.

For simplicity of concept, the group 314 is referred to below as including "non-RRA buffers" while the group 316 is referred to as including "RRA buffers." Likewise, in the following description, the term "RRA sectors" refers to sectors that are designated for decoding according to the RRA recovery scheme while the term "non-RRA sectors" refers to sectors that are designated for decoding according to the non-RRA recovery scheme (e.g., a retry scheme).

The buffers allocated to support each recovery scheme may be statically allocated (e.g., permanently allocated to support a designated one of the recovery schemes) or dynamically allocated (e.g., reallocated at different points in time to support different recovery schemes). According to one example dynamic buffer allocation scheme, all of the channel buffers 312 are initially allocated to support the RRA recovery scheme but the individual buffers are dynamically re-allocated to support the non-RRA scheme once released and/or once there are no more RRA sectors in the group of failed sectors remaining to be resolved.

After the detection/decoding block 300 receives a sequence of failed sectors (e.g., sectors read from a storage media that have been identified as including errors), the recovery scheme selector 308 selects a recovery scheme for use in associated with each individual one of the failed sectors.

The recovery scheme selected for each of the failed sectors is, in some instances, influenced by rules enforced by the decoding policy manager 302. In one implementation, the decoding policy manager 302 enforces a rule providing that a default recovery scheme is to be selected unless there is no available buffer to support the default scheme. For example, the recovery scheme selector 308 selects the RRA recovery scheme by default unless all of the RRA buffers (group 314) are already populated with failed data block data read during the current revolution of the media below the read element. In another implementation, the decoding policy manager 302 enforces a rule providing that the non-RRA buffers are to be filled and processed first.

In each of the above two implementations, the selection of the recovery scheme for a given data block is based on the location of the failed data block within the track (e.g., toward the beginning v. end of the track) as well as the total number of failed data blocks on the track in relation to the number of available buffers supporting each scheme.

The dynamic buffer manager 304 stores the failed sector data in a buffer that is in the buffer group designated to support the selected recovery scheme and also updates a block-to-buffer map 318 to reflect the current buffer location of the data. The dynamic buffer manager 304 also continuously manages a failed sector list 320 that indexes a set of failed sectors that are associated with the read command currently being processed (e.g., an executed command for which the host is still awaiting data due to the errors in the failed sectors that are awaiting resolution). For a read command targeting a single data track, the failed sector list 320 includes IDs of sectors located on the target data track.

As failed sectors are recovered by either the RRA recovery process or the non-RRA recovery process, the dynamic buffer manager 304 transmits the recovered sector data to the host, updates the failed sector list 320 to remove reference to the recovered sectors, and releases (frees up) the buffers previously holding the recovered sector data. If any of the failed sectors of the outstanding read command are not yet being processed, such as because there existed more failed sectors than available buffers, the dynamic buffer manager 304 may dynamically repopulate the released buffers with incoming sample data (acquisition reads) of these new (not-yet-processed) failed sectors. In turn, the new data in the re-populated channel buffers is processed by the detector and decoder 310.

In addition to tracking failed sectors remaining and sector-to-buffer mapping information, the dynamic buffer manager 304 may track the number of times that each RRA sector has been updated by a read sample combiner (not shown). For example, a first subset of failed sectors in RRA buffers may have been updated over 3 different rounds of read sample combining while another subset of the failed sectors may have been updated over 1 or 2 rounds, or not yet updated at all. The dynamic buffer manager 304 tracks this number for each sample such that read sample averaging can be implemented correctly (e.g., averaging is based on the true number of updates for the sample).

In at least one implementation where the dynamic buffer manager 304 is implemented in hardware, the above-described functionality facilitates hardware-level control of the entire RRA recovery process and concurrent non-RRA recovery. Consequently, the recovery processes may be carried out for a set time duration while channel buffer utilization is continuously maximized such that all channel buffers 312 are populated throughout the process so long as there remain more unrecovered failed data blocks than individual channel buffers.

The decoding policy manager 302 implements policies designed to ensure that the detector and decoder 310 processes all data samples acquired on a pass (e.g., disk revolution) prior to the end of the pass. Stated differently, the revolution time (1 rev, which is, for example, 8.3 milliseconds) represents a total available sample processing time that is fractionally allocated between all samples acquired and read into the channel buffers 312 on the current pass of the target track below the read element. This allocation may, in different implementations, depend on a variety of different considerations.

The most general way for the decoding policy manager 302 to allocate the decoding time (e.g., 1 disk rev) of the detector and decoder 310 among the stored samples is by leveraging logic that is based on the location of the failed sectors on the target track, the number of failed sectors, and the number of such sectors that are selected as RRA sectors v. non-RRA sectors. As explained with respect to FIG. 1, the detector and decoder 310 may work to decode data by iterating back and forth between operations of a detector (e.g., determining LLRs that each bit in the data stream is a 1 or a 0) and a decoder (e.g., that attempts to resolve errors in the bit stream using the LLRs). Each detector/decoder iteration may be understood as spanning a consistent, finite time interval referred to herein as simply a "decoder iteration." Thus, the total available decoding time on each pass (e.g., time for 1 disk rev) may also be represented in terms of these decoder iterations. According to one implementation, the decoding policy manager 302 allocates every non-RRA sector a predefined number of guaranteed decoder iterations 'M1' and every non-RRA sector a different predefined number of guaranteed decoder iterations 'M2.'

In one implementation, the recovery scheme providing the more "powerful" recovery tool is allocated the greater number of decoder iterations. For instance, an RRA recovery scheme is a more powerful tool than a re-read recovery scheme due to the fact that RRA samples improve over time while re-read samples tend to lead to successful recovery in a more limited subset of scenarios, such as when sample quality is affected by a head positioning error. Thus, in one implementation, the number of decoder iterations (M2) allocated to the RRA sectors is greater than the number of decoder iterations (M1) allocated to the non-RRA sectors.

In some implementations, the decoding policy manager 302 allocates decoder iterations among the failed sectors based upon a quality metric that the decoding policy manager 302 receives in association with each failed sector. For example, a drive bit detector may, on an initial read of the data track, compute a quality metric for each sector that quantifies how bad (e.g., a measure of how many errors) the failed sector contains. If this metric indicates that a particular failed sector is of fairly good quality and likely to converge, the decoding policy manager 302 may allocate a larger number of decoder iterations so as to increase the odds that the sector may recovered and the read command completed within a predefined command completion time (CCT).

If, in contrast, the decoding policy manager 302 receives a quality metric indicating that the failed sector is of poor quality and not likely to be recovered by the select recovery process (e.g., RRA), the decoding policy manager 302 may allocate a smaller number of decoder iterations to the sample. For example, the decision to allocate fewer decoder iterations to a poor quality sample may increase the odds that a greater number of other (higher quality) failed sectors may be recovered instead, thereby increasing odds of ultimately recovering the poor quality failed sector by way of a different recovery process, such as an iterative outer code or other process that may be sequentially performed following completion of the concurrent RRA and non-RRA processes discussed herein.

In still other implementations, the decoding policy manager 302 selects the number of decoding iterations for a sample based on the distribution and number of failed sectors along the data track. If, for example, a large number of failed sectors are located near the beginning of the track, the first few failed sectors to be read may be selected as free re-tries and allotted a small number of iterations, allowing for a larger total number of iterations to the remaining RRA sectors throughout the duration of the pass.

In addition to selecting the number of decoder iterations for each sample, the decoding policy manager 302 may in some implementations, elect to process samples in an order that is independent of the order of the corresponding sectors on the media. For example, the decoding policy manager 302 implements logic that governs whether a currently held and not-yet-processed sample is be held or dropped a new sector arrives at the buffer space when all buffers are full. In cases where the quality metric is available, lower quality samples may be dropped in favor of higher quality samples.

Further examples of sample prioritization logic are discussed in detail with respect to FIGS. 4 and 5.

FIG. 4 illustrates an exemplary sequence of recovery operations 400 performed according to example decoding policies that guarantee a number of decoding iterations for one recovery scheme while managing another concurrent recovery scheme with elasticity among remaining channel buffers. In the illustrated example, there exist a first number 'It' of read channel buffers allocated to support an RRA recovery scheme ("RRA buffers") and a single spare buffer that is allocated to support a free retry recovery scheme (the "free retry buffer"). The policies and principles discussed with respect to this example may equally apply to scenarios where there exist a larger number of free retry buffers and/or where free retry buffers are dynamically created by reallocating RRA buffers, such as when RRA sector data is successfully recovered.

As described with respect to other figures herein, the RRA buffers are (prior to the recovery operations of FIG. 4) initially populated with a subset of the failed sectors selected for the RRA process (RRA sectors). In FIG. 4, sectors labeled $s_1, s_2, s_3 \ldots s_{R-1}, s_R$ represent the subset of RRA sectors. The remaining sectors, $s_P, s_T, s_{T+1}, s_u, s_{u+1}$ represent the subset of the failed sectors selected for the free retry process (free retry sectors).

As discussed with respect to other figures herein, RRA sectors are initially acquired and updated with each pass of the read element over the target data track. Following each update, a decoding attempt is performed. Each RRA sector is retained in the channel buffer space until its associated data is recovered or until the entire RRA process is complete (e.g., all RRA sectors are recovered or a set time elapses without convergence of one or more sectors). In contrast, free retry sectors are read anew (not read-averaged) on each pass, and decoding is attempted. Free retry sectors are not retained in the buffer space across multiple passes and may be overwritten by other free retry sectors as such samples arrive.

Operations shown in a top region 402 of FIG. 4 illustrate a state of a read operation over time (time progressing from left to right) throughout a single pass of a target data track beneath the read element. Positions of each of the failed sectors, including both RRA sectors and free retry sectors ($S_1, S_2, S_3 \ldots S_{R-1}, S_R, S_P, S_T, S_{T+1}, S_u, S_{u+1}$) are distributed along the time axis so as to represent the corresponding time that each sector passes beneath the read head. Each sector includes an annotation (e.g., 'r', 'a', '1', '2') to indicate the type of data stored in the buffer. Here, 'r' indicates that the sector was acquired as a free retry (e.g., to be released at the end of the pass); 'a' indicates that the sector is an RRA sectors that was acquired for the first time on the current pass; '1' indicates that the sector is an RRA sector that has been read-averaged once based on a second read of the sample; and '2' indicates that the sector is an RRA sector that has been read-averaged twice based on three read s of the sample.

A lower region 404 of FIG. 4 illustrates decoding operations that are being performed by an iterative decoder (e.g., the detector and decoder of FIG. 1) along the same time axis as the above-described read operations.

At a first time t1, the sector $S_1$ is read into an RRA buffer. As soon as the data arrives in the buffer (at time t2), the iterative decoder begins decoding the $S_1$. In the illustrated example, the storage drive implements a decoding policy under which each of the RRA sectors $S_1, S_2, S_3 \ldots S_{R-1}, S_R$ is allocated a guaranteed decoder time of up to M1 iterations of the iterative decoder, meaning that M1 iterations are performed unless the sector is recovered in fewer than M1 iterations. Free retry sectors are not guaranteed this same number of iterations and are instead, handled according to a policy of elasticity, which is discussed further below.

While the iterative decoder is working on sector $S_1$, read samples of other RRA sectors continue to arrive within the RRA buffer space. As soon as the iterative decoder finishes the M1 iterations on sector $S_1$ (e.g., an unsuccessful recovery), the iterative decoder begins work on the next sector that has arrived, $S_2$. The iterative decoder finishes the M1 iterations on $S_2$ and performs M1 iterations next on $S_3$, and so on all the way up through the last-received RRA sector, $S_R$. In the meantime, a first one of the free retry sectors, $S_P$, has been read into the sole free retry buffer.

After all the RRA sectors are processed according to their pre-allocated guaranteed decoder time (M1 iterations), the drive determines the amount of decode time to allocate the remaining free retry sectors based on a policy of channel buffer availability, also referred to herein as "elasticity." In general, elasticity refers to a policy of defining a number of decoding iterations to perform on a data block based on a time that a next consecutively-read data block is expected to arrive in the read channel (e.g., so as to ensure that a decoder is finishing processing a previously-received data block by the time the next consecutively-read data block arrives).

In the example of FIG. 4 where there exists a single free retry buffer, an elasticity policy provides that each free-retry sector can be worked on by the iterative decoder all the way up until the next free-retry sector has been stored in the buffer, overwriting the previously-worked on sample. For example, per the policy of elasticity, the decoder can process $S_P$ up until its sample is evicted from the free retry buffer in favor of $S_T$ (at time t4); likewise, the decoder can process $S_{T+1}$ up until its sample is evicted from the free retry buffer in favor of $S_U$, which is processed up until it is evicted in favor of $S_{U+1}$, which can then be worked on until the end of the track revolution. It is by example and without limitation that FIG. 4 includes a single free retry buffer. The principle of elasticity can naturally be extended to scenarios with multiple free retry buffers by implementing logic that selected decoder iteration time to ensure that at least one of the free retry buffers is available to receive data at the time the next free retry sample arrives in the buffer space.

In the example of FIG. 4, RRA sectors are prioritized (received/processed first with high number of iterations M1) and elasticity is used to determine the number of decoder iterations to assign to the free retry sectors. In other implementations, free retry sectors may be prioritized over RRA sectors and/or elasticity may be used to determine the number of decoder iterations to assign to the RRA sectors. If, for example, a large number of errors occur early in the disk revolution, performance may be enhanced if the decoder works on the free retry sectors first and devotes the rest of the pass to a high number of iterations on each of the RRA sectors.

FIG. 5 illustrates an example sequence of recovery operations 500 performed by a storage drive according to decoding policies that provide for a first predefined number of decoding iterations for sectors processed according to a first recovery scheme (e.g., RRA sectors) and that provide for a second predefined number of decoding iterations for some, but not all, sectors processed according to a second recovery scheme (e.g., free retry sectors). In the illustrated implementation, the RRA sectors are managed similar to that of FIG. 4 above. Each RRA sector is allocated up to a specified maximum time limit (M1 iterations) of decoder processing time. In this case, the free retry sectors are also allotted up to a specified maximum time limit (M2 iterations) rather than using channel elasticity; however, the M2 iterations are not guaranteed. For example, an incoming free retry sector may be dropped if there is no free buffer availability.

The illustrated example is similar to that of FIG. 4 in that there exist a number 'R' of read channel buffers allocated to support an RRA recovery scheme and a single spare buffer that is allocated to support a free retry recovery scheme. In FIG. 5, sectors labeled $S_1$, $S_2$, $S_3$ . . . $S_{R-1}$, $S_R$ represent the subset of failed sectors designated as RRA sectors. The remaining sectors, $S_P$, $S_T$, $S_{T+1}$, $S_U$, $S_{U+1}$ represent the subset of the failed sectors designated as free retry sectors.

Operations shown in a top region 502 of FIG. 5 illustrate a state of a read operation over time (time progressing from left to right) throughout a single pass of a target data track beneath the read element. Positions of each of the failed sectors, including both RRA sectors and free retry sectors are distributed along the time axis so as to represent the corresponding time that each sector passes beneath the read head. Operations shown in a lower region 504 of FIG. 5 illustrate decoding operations that are being performed by an iterative decoder along the same time axis as the read operations.

The handling of RRA sectors is identical to that described with respect to FIG. 4. Each RRA sector is allotted a guaranteed maximum decoding time of M1 iterations, meaning that each sector will be worked on for M1 iterations unless it is recovered in fewer iterations. In FIG. 5, the free retry sectors are allotted a maximum decoding time of M2 iterations that is not guaranteed, meaning that each sector will be worked on for M2 iterations unless it is recovered in fewer iterations or there is insufficient channel elasticity to permit M2 iterations, in which case the sector is dropped.

When, for example, the decoder finishes processing the M1 iterations of sector $S_R$ (at time t1), the decoder determines that sector $S_T$ is going to arrive (at time t2) before a full M2 iterations can be performed on the next-received sector, $S_P$. Stated differently, the time interval Q is less than M2, so $S_P$ is dropped and the decoder instead begins work on $S_T$ instead. (Alternatively, $S_P$ could be given the full M2 iterations and $S_T$ could be dropped if the M2 iterations for $S_P$ are not complete by the time the read-head is above $S_T$.) The decision of which sector to drop and which to keep may be based on different factors in different implementations. In one implementation, this decision is based on quality metric. If, for example, a quality metric indicates that $S_T$ is a higher quality sample than $S_P$, this may satisfy a condition for dropping $S_P$ and processing the higher quality sample $S_T$ instead.

The decoder performs a full M2 iterations on $S_T$. Here, there is enough channel elasticity that the decoder could plausibly work on $S_T$ longer (all the way up until $S_U$ is written to the buffer, at t4). However, the predefined decoding policy guaranteeing a maximum of M2 iterations takes precedence; thus, the decoder stops processing $S_T$ at time t3. In this scenario, the decoder next has to choose to drop one of $S_{T+1}$ and $S_U$ because there is not enough time to finish M2 iterations on $S_{T+1}$ between t3 and the arrival of $S_U$ in the channel (e.g., the time interval R is less than M2). Consequently, $S_U$ is either dropped (not written to a buffer) or else it is stored in place of not-yet-processed $S_{T+1}$, which is dropped. Here, the drive elects the latter scenario and overwrites $S_{T+1}$ with $S_U$. $S_U$ is processed for the full M2 iterations, followed by $S_{U+1}$.

Due to the decoding policy that allows for dropping sectors under the above-described circumstances, it is possible that the storage drive may process the set of failed sectors in an order that is different than the order in which the data blocks are read from the medium. For example, $S_P$ and $S_{T+1}$ may be processed on a later revolution of the disk, after $S_T$ and $S_U$ have been processed and/or recovered (e.g., block processing is out-of-order relative to the full sequence of data blocks shown in the top region 502 of FIG. 5).

Although not specifically shown herein, some implementations utilize elasticity to assign decoding time for both RRA and free retry sectors. Other implementations utilize a mix of fixed decoder time and elasticity for the same type of sector. For example, the drive may implement a policy under which M2 iterations are allotted to free retry sectors unless there is insufficient channel elasticity to support M2 iterations, in which case the sector is allotted a maximum number of iterations that the channel elasticity can support (instead of dropping the sample completely, as in the example of FIG. 5).

Figure 6:
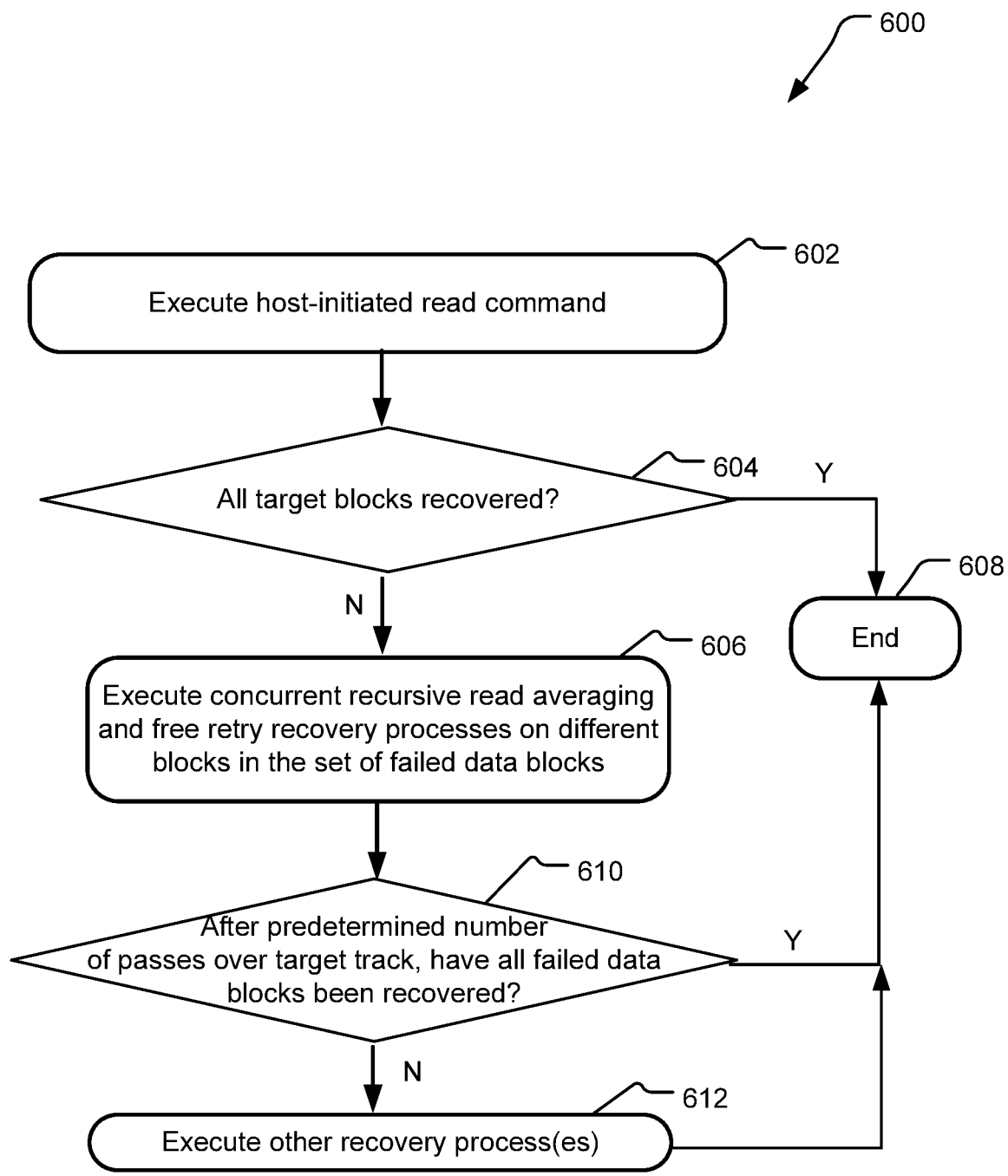
FIG. 6 illustrates example operations for implementing concurrent RRA and free retry recovery schemes utilizing a same channel buffer space.

FIG. 6 illustrates example operations 600 for implementing concurrent RRA and free retry recovery schemes utilizing a same read channel buffer space. An execution operation 602 executes a host read command. A determination operation 604 determines whether all data blocks requested by the command were recovered. If so, the process is termination by a termination operation 608.

If, however, the determination operation 606 determines that all sectors were not recovered, a recovery process 610 initiates a dual process recovery scheme under which while RRA operations and free retry operations occur concurrently. For example, on a single pass of the read head, some failed data blocks are managed according to an RRA recovery scheme while other data blocks are managed according to a free retry recovery scheme. This dual process recovery scheme continues for some number of predetermined passes. At the end of the predetermined number of passes, a determination operation 612 determines whether all failed data blocks have been recovered. If so, the process is terminated by the termination operation 608. If failed data blocks remain, a second recovery process 614 launches one or more other sequential recovery algorithms. For example, the remaining unrecovered sectors may be provided to an iterative outer code (IOC) or a specialized recovery process.

The embodiments of the disclosed technology described herein are implemented as logical steps in one or more computer systems. The logical operations of the presently disclosed technology are implemented (1) as a sequence of processor-implemented steps executing in one or more computer systems and (2) as interconnected machine or circuit modules within one or more computer systems. The implementation is a matter of choice, dependent on the performance requirements of the computer system implementing the disclosed technology. Accordingly, the logical operations making up the embodiments of the disclosed technology described herein are referred to variously as operations, steps, objects, or modules. Furthermore, it should be understood that logical operations may be performed in any order, adding and omitting as desired, unless explicitly claimed otherwise or a specific order is inherently necessitated by the claim language.

The above specification, examples, and data provide a complete description of the structure and use of exemplary embodiments of the disclosed technology. Since many embodiments of the disclosed technology can be made without departing from the spirit and scope of the disclosed technology, the disclosed technology resides in the claims hereinafter appended. Furthermore, structural features of the different embodiments may be combined in yet another embodiment without departing from the recited claims.

What is claimed is:

1. A method comprising:
    identifying a set of failed data blocks read from a storage medium during execution of a read command;
    populating sample buffers in a read channel with data of a first subset of the set of failed data blocks;
    initiating an error recovery process on the data in the sample buffers, the error recovery process being a read sample combining process that entails multiple rounds of read averaging to update previously-stored samples based on newly-sampled read data;
    responsive to successful recovery of one or more data blocks in the first subset, releasing the recovered data from the sample buffers and repopulating sample buffer locations previously-storing the recovered data with data of a second subset of the set of failed data blocks prior to completion of the multiple rounds of read averaging on the first subset of the failed data blocks; and
    initiating the error recovery process on the data of the second subset of the failed data blocks while the error recovery process is ongoing with respect to data of the first subset of failed data blocks remaining in the sample buffers.

2. The method of claim 1, wherein the multiple rounds of read averaging are performed without firmware intervention.

3. The method of claim 2, further comprising:
    during each of the multiple rounds of the read sample combining recovery process, allocating different numbers of decoding iterations to different data blocks in the set of failed data blocks.

4. The method of claim 1, wherein releasing the recovered data from the sample buffers and repopulating the sample buffers with the data of the second subset of failed data blocks further comprises:
    dynamically freeing up one or more of the sample buffers prior to a last round of the multiple rounds of the read sample combining recovery process; and
    repopulating the freed-up sample buffers with the data of the second subset of the set of failed data blocks without freeing up another subset of the sample buffers storing data of the first subset of the failed data blocks not yet successfully recovered.

5. The method of claim 1, wherein the multiple rounds of the read sample combining process are effective to perform decoding operations on a greater number of data blocks than there exist sample buffers in the read channel.

6. The method of claim 1, further comprising:
    dynamically tracking, in hardware, a subset of the failed data blocks that remain to be recovered as the subset is reduced in size with each subsequent round of an ongoing read sample combining recovery process.

7. The method of claim 1, further comprising:
    dynamically tracking, in hardware, a count value for data currently held in each one of a subset of the sample buffers allocated to a read sample combining process, the count value indicating a number of update rounds that a data sample stored within the buffer has been subjected to.

8. The method of claim 1, further comprising:
    decoding the set of failed data blocks according to an order that is different than the order for which failed data blocks are arranged on the storage medium.

9. A system comprising:
    read channel hardware adapted to:
        receive a set of failed data blocks read from a storage medium during execution of a read command;

populate sample buffers in a read channel with data of a first subset of the set of failed data blocks;

initiate an error recovery process on the data in the sample buffers, the error recovery process being a read sample combining process that entails multiple rounds of read averaging to update previously-stored samples based on newly-sampled read data;

responsive to successful recovery of one or more data blocks in the first subset, release the recovered data from the sample buffers and repopulate sample buffer locations previously-storing the recovered data with data of a second subset of the set of failed data blocks prior to completion of the multiple rounds of read averaging on the first subset of the failed data blocks; and initiate the error recovery process on the data of the second subset of the failed data blocks while the error recovery process is ongoing with respect to data of the first subset of failed data blocks remaining in the sample buffers.

10. The system of claim 9, wherein the multiple rounds of read averaging are performed without firmware intervention.

11. The system of claim 9, wherein the read channel hardware is further adapted to:
release the recovered data from the sample buffers without releasing other data of the first subset of failed data blocks that has not yet been recovered.

12. The system of claim 9, wherein the multiple rounds of the read sample combining process are effective to perform decoding operations on a greater number of data blocks than there exist sample buffers in the read channel.

13. The system of claim 9, wherein the read channel hardware is further adapted to:
during each of the multiple rounds of the read sample combining process, allocate different numbers of decoding iterations to different data blocks in the set of failed data blocks.

14. The system of claim 9, wherein the read channel hardware is further adapted to:
dynamically track a subset of the failed data blocks that remain to be recovered as the subset is reduced in size with each subsequent round of an ongoing read sample combining recovery process.

15. The system of claim 9, wherein the read channel hardware is further adapted to:
dynamically track a count value for data currently held in each one of a subset of the sample buffers allocated to a read sample combining process, the count value indicating a number of update rounds that data stored within the buffer has been subjected to.

16. The system of claim 9, wherein the read channel hardware is further adapted to:
manage a block-to-buffer map to dynamically track, in hardware, a buffer location for data stored in association with each one of the failed data blocks.

17. One or more tangible computer-readable storage media encoding instructions for executing a computer process, the computer process comprising:
identifying a set of failed data blocks read from a storage medium during execution of a read command;

populating sample buffers in a read channel with data of a first subset of the set of failed data blocks;

initiating an error recovery process on the data in the sample buffers, the error recovery process being a read sample combining process that entails multiple rounds of read averaging to update previously-stored samples based on newly-sampled read data;

responsive to successful recovery of one or more data blocks in the first subset, releasing the recovered data from the sample buffers and repopulating sample buffers locations previously-storing the recovered data with data of a second subset of the set of failed data blocks prior to completion of the multiple rounds of read averaging on the first subset of the failed data blocks; and initiating the error recovery process on the data of the second subset of the failed data blocks while the error recovery process is ongoing with respect to data of the first subset of failed data blocks remaining in the sample buffers.

* * * * *